United States Patent [19]

Roos

[11] Patent Number: 4,839,578
[45] Date of Patent: Jun. 13, 1989

[54] METHOD FOR REMOVING PHASE INSTABILITIES CAUSED BY FLEXURE OF CABLES IN MICROWAVE NETWORK ANALYZER MEASUREMENTS

[75] Inventor: Mark D. Roos, San Carlos, Calif.

[73] Assignee: EIP Microwave, Inc., San Jose, Calif.

[21] Appl. No.: 59,701

[22] Filed: Jun. 4, 1987

[51] Int. Cl.⁴ .................. G01R 27/06; G01R 25/04
[52] U.S. Cl. .................. 324/58 B; 324/58.5 B; 324/83 R
[58] Field of Search .............. 324/58 R, 58 B, 58.5 B, 324/58.5 R, 83 FE, 83 R, 84; 331/1 R; 328/150, 155; 307/511, 516; 333/17 R

[56] References Cited

U.S. PATENT DOCUMENTS 4,135,397  1/1979  Krake ..................... 324/58.5 B X
4,281,285  7/1981  Bastida ................... 324/58.5 B
4,721,901  1/1988  Ashley .................... 324/58 B

OTHER PUBLICATIONS

Oliver, "Time Domain Reflectometry", Hewlett-Packard Journal, vol. 15, No. 6, Feb. 1964, pp. 1-8.

Primary Examiner—Reinhard J. Eisenzopf
Assistant Examiner—Warren S. Edmonds
Attorney, Agent, or Firm—Nilsson, Robbins, Dalgarn, Berliner, Carson & Wurst

[57] ABSTRACT

A method for removing phase errors from RF signals generated by movement of the cable interconnecting a network analyzer and a device under test. The method includes the steps of measuring the phase difference between incident and reflected signals during calibration to establish a reference, measuring the phase difference between incident and reflected signals during device testing, comparing this result to the reference to generate an error signal from phase correction.

5 Claims, 1 Drawing Sheet

METHOD FOR REMOVING PHASE INSTABILITIES CAUSED BY FLEXURE OF CABLES IN MICROWAVE NETWORK ANALYZER MEASUREMENTS

BACKGROUND OF THE INVENTION

This invention relates to RF network analyzers and more particularly to a method for removing phase errors generated in measurement signals resulting from movement of the cable connected between the device under test and the source of RF signals.

Characterizing various components and circuits within a particular frequency domain is critical in both the design and testing of electronic circuits. Only by knowing the phase characteristics of each such component or circuit can one be certain of meeting required objectives. Significant progress has been made in the prior in the development of network analyzers to characterize various aspects of circuits and components. However, a significant problem still remains. Subsequent to calibration of the system the cable which is utilized to interconnect the signal source to the device under test is moved, at least to some extent, while disconnecting the calibration circuit and connecting the device under test. At the time of calibration traditionally both the calibration circuit and cable are measured. Thus any change in the shape or position of the cable destroys the accuracy of the calibration. This inaccuracy can be as much as 100 times error compared to the accuracy of the remainder of the system.

To attempt to compensate for this error the operators of network analyzers have excercised extreme care to minimize movement of the cable when disconnecting the calibration circuit and connecting the device under test thereto. Also the suppliers of the cables have provided different and better cables which has assisted in further decreasing the errors which have been experienced. However, irrespective of the improvement in the cable and the care exercised by the operators, errors on the order of 2% to 3% still exist.

SUMMARY OF THE INVENTION

A method of removing phase errors in an RF signal caused by movement of a cable which includes terminating said cable with a reflection means having a stable phase and measuring both incident and reflected energy to provide a reference signal, connecting a device under test to the cable and thereafter sampling both transmitted and reflected signals to establish a phase error signal, comparing the phase error signal to the predetermined reference signal to develop a correction signal for changing the frequency of the signal source to compensate for the phase error.

DETAILED DESCRIPTION

Traditionally in utilization of network analyzers the circuit for developing appropriate IF signals for obtaining data to generate the characteristics of a device under test has been located in the chassis along with the signal generator. A cable has been connected between the chassis and the device under test with the appropriate RF signal being transmitted over the cable to the device under test. Manipulation of the cable subsequent to calibration thereof has generated both amplitude and phase errors in the signals generated as a result of the use of the network analyzer.

Through utilization of a test head which is connected at the terminus of the cable remote from the source and adjacent the device under test amplitude error signals have been eliminated. Such a test head is disclosed in detail in application Ser. No. 914,039, filed Oct. 1, 1986 for testing head device for microwave network analyzer, which application is assigned to the assignee of this application. As is therein disclosed appropriate sampling of transmitted and reflected test signals is accomplished along with mixing thereof with a local oscillator signal to generate an intermediate frequency signal which is then returned to the network analyzer for appropriate processing. Since the generation of the IF signal utilizing such a test head takes place effectively at the device under a test, substantial errors resulting from manipulation of the cable subsequent to calibration thereof have been eliminated. However, it will be recognized by those skilled in the art that phase in a signal is proportional to the length of the cable through which the RF signal propagates. If the cable is bent, that is its position changed, subsequent to the calibration the effective electrical length of the cable is varied accordingly. Such variations in the effective length then necessarily affect the phase in the signal being propagated among the cable. Such variations in the phase of the signal from those present during calibration will necessarily result in a phase error signal in the IF signals generated during testing of the device under test. The method of the present invention provides a means for substantially eliminating the residual phase error signal which will almost always be present since practice illustrates that it is virtually impossible to eliminate at least some movement of the cable carrying the RF signal when connecting the device under test to the cable or to the testing head.

Figure 1:
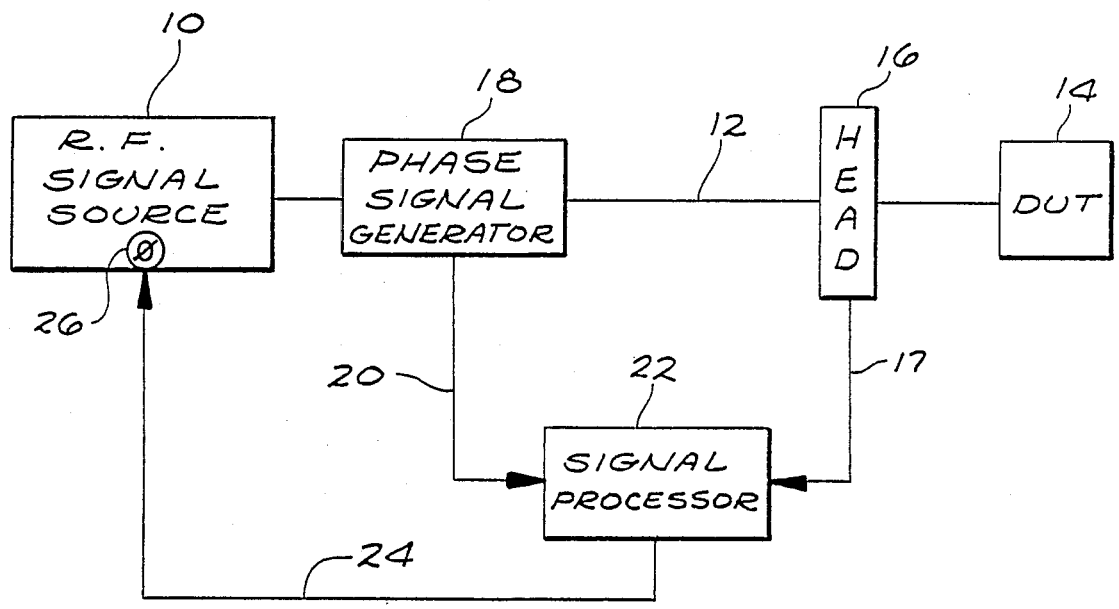
FIG. 1 is a schematic block diagram illustrating a circuit for carrying out the method of the present invention.

As is shown in FIG. 1, an RF signal is provided from a source 10 thereof by way of a cable 12 to a device under test 14. A test head 16 of the type above described may be affixed to the cable 12 and it in turn attached to the device under test 14. Disposed at the RF signal source 10 is a phase signal generator 18 which develops an output signal present on the cable 20 which is proportional to the phase differences between the incident signal emanating from the source 10 and the reflected signal from the apparatus terminating the cable 12. The output signal 20 which is typically a D/C signal is applied to a signal processor 22 where it may be compared to a reference signal previously determined. The differences between the phase signal applied over the cable 20 to the signal processor 22 and the reference signal previously developed in turn develops an error signal which is applied over the cable 24 to the signal source 10 to compensate for the error signal. For example, the error signal appearing on the cable 24 may be applied to a phase shifting network 26 which may form a part of the RF signal source. The phase shifting network 26 which may form a part of the RF signal source. The phase shifting network 26, as those skilled in the art are aware, will, responsive to the error signal, change the phase of the signal generated by the RF signal source 10 to compensate for the errors as above outlined.

Figure 2:
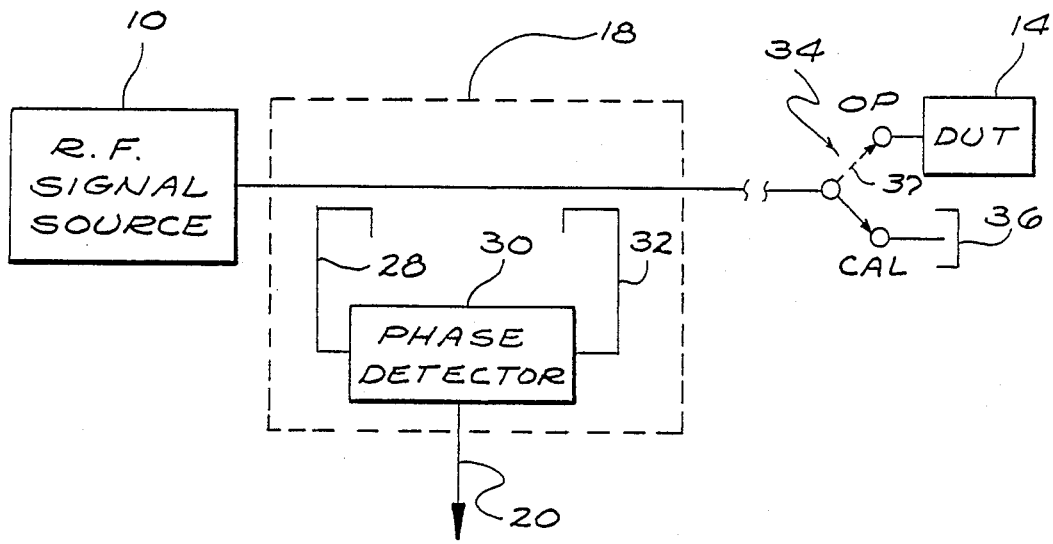
FIG. 2 is a schematic block diagram showing in greater detail a portion of the circuit of FIG. 1.

By referring now more specifically to FIG. 2 the phase signal generator 18 is shown in greater detail. As is therein shown, the phase signal generator 18 includes a first directional coupler 28 arranged to sample the incident signal from the source 10 and to provide such sampled signal to a phase detector 30. A second directional coupler 32 is provided to sample the reflected signal from the termination of the cable 12 and to provide the sample to the phase detector 30. The phase detector 30 is a simple state of the art phase detection network well known to those skilled in the art. The phase detector 30 by comparing the incident and reflected signals provide an output signal, typically D/C, on the cable 20 which is proportional to the phase difference of the incident and reflected signals.

The cable 12 may be terminated as is shown schematically by the switch 34 in a calibrate (CAL) mode where a reflection means having a stable phase is utilized, such for example as the short 36. When in the calibrate mode the signal source 10 is swept through the range of frequencies which are of interest with regard to a particular microwave device whose characteristics are to be determined. As the frequency is swept through the desired range, both incident and reflected energy is constantly being applied to the phase detector 30 and a continuous D/C signal is being developed at the cable 20 thereof. The signal 20 may be viewed as a reference which establishes a predetermined reference level of the calibrated phase for the cable 12. The signal appearing at the cable 20 may for example be stored in a memory in the signal processor 22.

After the calibration step has been completed the device under test is then connected to the cable 12 as is shown symbolically by the dashed symbol 37 being transferred to the operational (OP) phase for the network analyzer. As will be understood by those skilled in the art, typically the calibrating circuit (short) 36 will physically be removed from the cable or the head and the device under test physically connected thereto. After connection of the device under test 14 the signal from the signal source 10 is again swept through the range of frequencies as desired and during the time that tests are being conducted the output signal generated by the head 16 is applied over the cable 17 to the signal processor 20 to produce the desired output signals representative of the characteristics of the device under test 14 as will be well understood by those skilled in the art. At the same time the phase signal generator 18 will again function in the manner above described to provide a signal at the cable 20 representative of the phase difference between the incident and reflected signals with the device under test 14 connected to the cable 12 or the head 16. The output signal appearing at the cable 20 is then applied to the signal processor 22 where it is compared to the reference resident in the memory thereof. Any differences existing between the reference and operational signals will result in the development of a correction signal which is then applied over the cable 24 to compensate for the phase differences resulting from a movement of the cable 12.

As can be seen by those skilled in the art the present invention provides a relatively simply way to compensate for phase errors resulting from movement of the cable interconnecting the signal source and the device under test subsequent to calibration thereof. In addition the method of the present invention does not affect the normal operation of the network analyzer and does not require the exercise of excessive caution in connecting the device under test to the circuit. It has been found that the reflection characteristics of the device under test, for example such as an amplifier, operate exceedingly well in carrying out the method of the present invention. If desired, however, some other type of element capable of reflection of a part of the signal and having a stable phase may be utilized in place of the amplifier or other device under test should such be desired.

What is claimed is:

1. A method of removing phase errors in any signal caused by movement of a cable carrying the signal comprising:

terminating said cable with a reflection means having a stable phase;

providing a source of microwave frequency electromagnetic energy signals;

transmitting a microwave frequency electromagnetic energy signal from said source along said cable from an input to an output thereof;

sampling said transmitted signal;

reflecting a portion of said transmitted signal from the reflection means terminating said cable;

sampling said reflected signal;

measuring the phase difference between said transmitted and reflected signals to establish a predetermined reference signal representative of said phase difference;

removing said reflection means from termination of said cable;

connecting a device under test (DUT) to said cable;

applying said transmitted microwave freqeuncy signal to said DUT;

sampling said transmitted signal and any signal reflected by said DUT;

measuring the phase difference between said transmitted and DUT reflected signals to establish an error signal;

comparing said error signal to said predetermined reference signal to develop a correction signal; and applying said correction signal to said source of microwave frequency signals for changing the characteristics of said transmitted signal to compensate for said error.

2. The method as defined in claim 1 wherein said transmitted signal sweeps through a range of frequencies.

3. The method of defined in claim 2 wherein said sampling and measuring is accomplished substantially constantly throughout said frequency range.

4. The method as defined in claim 3 which further includes the step of recording said predetermined reference signal.

5. The method as defined in claim 3 which further includes applying said correction signal to a phase shifting network.

* * * * *